United States Patent
Heo et al.

(10) Patent No.: US 11,709,564 B2
(45) Date of Patent: Jul. 25, 2023

(54) ELECTRONIC DEVICE COMPRISING SENSOR FOR TOUCH RECOGNITION AND SENSOR FOR HOVERING RECOGNITION, AND METHOD FOR OPERATING SAME

(71) Applicant: Samsung Electronics Co., Ltd., Suwon-si (KR)

(72) Inventors: Hoondo Heo, Suwon-si (KR); Sangheon Park, Suwon-si (KR); Seunghoon Ko, Suwon-si (KR); Minuk Kim, Suwon-si (KR); Keunsik Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/286,628

(22) PCT Filed: Nov. 1, 2019

(86) PCT No.: PCT/KR2019/014711
§ 371 (c)(1),
(2) Date: Apr. 19, 2021

(87) PCT Pub. No.: WO2020/091508
PCT Pub. Date: May 7, 2020

(65) Prior Publication Data
US 2021/0318789 A1    Oct. 14, 2021

(30) Foreign Application Priority Data
Nov. 2, 2018    (KR) .................. 10-2018-0133567

(51) Int. Cl.
G06F 3/041    (2006.01)
G06F 3/044    (2006.01)
H10K 59/40    (2023.01)

(52) U.S. Cl.
CPC ........ *G06F 3/04166* (2019.05); *G06F 3/0445* (2019.05); *G06F 3/0446* (2019.05);
(Continued)

(58) Field of Classification Search
CPC ............. G06F 3/0446; G06F 3/041662; G06F 3/0445; G06F 3/04166; G06F 2203/04108;
(Continued)

(56) References Cited

U.S. PATENT DOCUMENTS

2010/0328259 A1    12/2010    Ishizaki et al.
2011/0248934 A1    10/2011    Veh et al.
(Continued)

FOREIGN PATENT DOCUMENTS

EP    2 660 691 A1    11/2013
JP    2011-028721 A    2/2011
(Continued)

*Primary Examiner* — Towfiq Elahi
(74) *Attorney, Agent, or Firm* — Jefferson IP Law, LLP

(57) ABSTRACT

According to various embodiments, an electronic device may comprise: one or more first electrodes; one or more second electrodes arranged in at least a different direction from the one or more first electrodes; one or more third electrodes arranged between the one or more second electrodes, respectively, in the same direction as the second electrodes when viewed from above; and a control circuit, wherein the control circuit is configured to detect touch information related to an external object, at least on the basis of a change in a capacitance value between at least a part of the one or more first electrodes and at least a part of the one or more second electrodes, and detect hovering information related to the external object, at least on the basis of a capacitance value related to at least a part of the one or more third electrodes. Various other embodiments are possible.

6 Claims, 13 Drawing Sheets

(52) U.S. Cl.
CPC .............. *G06F 2203/04108* (2013.01); *G06F 2203/04111* (2013.01); *H10K 59/40* (2023.02)

(58) Field of Classification Search
CPC . G06F 2203/04111; G06F 2203/04101; H01L 27/323
See application file for complete search history.

(56) References Cited

U.S. PATENT DOCUMENTS

| | | | |
|---|---|---|---|
| 2011/0304578 A1* | 12/2011 | Kim ...................... | G06F 3/0446 345/174 |
| 2013/0278560 A1 | 10/2013 | Yamaguchi | |
| 2014/0320451 A1* | 10/2014 | Lee ..................... | G06F 3/04166 345/174 |
| 2015/0075959 A1* | 3/2015 | Lu ....................... | G06F 3/04166 200/5 R |
| 2015/0153887 A1 | 6/2015 | Kim et al. | |
| 2016/0179273 A1 | 6/2016 | Lee et al. | |
| 2017/0153744 A1 | 6/2017 | Kang et al. | |
| 2018/0095587 A1* | 4/2018 | Kurasawa ............. | G06F 3/0416 |

FOREIGN PATENT DOCUMENTS

| | | |
|---|---|---|
| JP | 2015-041160 A | 3/2015 |
| KR | 10-2011-0113547 A | 10/2011 |
| KR | 10-2016-0004242 A | 1/2016 |
| KR | 10-2017-0064139 A | 6/2017 |
| KR | 10-1742052 B1 | 6/2017 |

\* cited by examiner

ELECTRONIC DEVICE COMPRISING SENSOR FOR TOUCH RECOGNITION AND SENSOR FOR HOVERING RECOGNITION, AND METHOD FOR OPERATING SAME

CROSS-REFERENCE TO RELATED APPLICATION(S)

This application is a U.S. National Stage application under 35 U.S.C. § 371 of an International application number PCT/KR2019/014711, filed on Nov. 1, 2019, which is based on and claimed priority of a Korean patent application number 10-2018-0133567, filed on Nov. 2, 2018 in the Korean Intellectual Property Office, the disclosure of which is incorporated by reference herein in its entirety.

TECHNICAL FIELD

Various embodiments of the present disclosure relate to an electronic device including a sensor for touch recognition and a sensor for hovering recognition, and an operating method of the electronic device.

BACKGROUND ART

An electronic device including a touch screen has been actively introduced. The electronic device may receive a user touch input onto a screen displayed on a touch screen. Alternatively, the electronic device may receive a hovering input onto the screen displayed on the touch screen. The electronic device may provide various functions by processing the user touch input or the hovering input.

For example, the electronic device may receive a touch input to select an application icon included in the screen displayed on the touch screen, execute an application corresponding to the icon, and display an execution screen. Alternatively, the electronic device may receive the hovering input and move an icon displayed on the screen.

DETAILED DESCRIPTION OF THE INVENTION

Technical Problem

There are various types of electronic devices including touch screens. For various electronic devices, sizes or use environments of touch screens may be various according to usage purposes of the electronic devices. As a result, performance improvement of a touch input or a hovering input to a touch screen in an electronic device is required. The electronic device increasingly needs to accurately measure the touch input or the hovering input. However, when the area of a sensor is increased for performance improvement, degradation may occur in the linearity and recognition area of a touch, limiting an increase in the area of the sensor in the electronic device.

An electronic device according to various embodiments may include a sensor for a touch input and a sensor for a hovering input while maintaining the same sensor area. Consequently, the accuracy of the touch input may be improved in the limited sensor area and a hovering recognition distance may be sufficiently secured.

An electronic device according to various embodiments may connect one or more non-connected electrodes to a transmission (TX) electrode or a reception (RX) electrode for detecting a touch input in a youm (Y)-on-cell touch active-matrix organic light-emitting diode (AMOLED) (Y-OCTA) touch sensor, and use the connected electrodes as a sensor for a hovering input.

Technical Solution

According to various embodiments, an electronic device includes one or more first electrodes, one or more second electrodes disposed in a direction that is at least different from a direction of the one or more first electrodes, one or more third electrodes, when viewed from top, disposed between the one or more second electrodes in a direction that is the same as the direction of the one or more second electrodes, and a control circuit, in which the control circuit is configured to detect touch information related to an external object, at least based on a change of a capacitance between at least some first electrode of the one or more first electrodes and at least some second electrode of the one or more second electrodes and to detect hovering information related to the external object, at least based on a capacitance related to at least some third electrode of the one or more third electrodes.

According to various embodiments, an electronic device includes one or more first electrodes included in at least a part of a first node, one or more second electrodes included in at least a part of a second node, one or more third electrodes included in at least a part of the first node or the second node and disposed by being connected to each other, and a control circuit, in which the control circuit is configured to detect touch information related to an external object, at least based on a change of a capacitance between at least some first electrode of the one or more first electrodes and at least some second electrode of the one or more second electrodes and to detect hovering information related to the external object, at least based on a capacitance related to at least some third electrode of the one or more third electrodes.

Advantageous Effects

According to various embodiments, an electronic device and an operating method thereof may be provided in which additional electrodes for detecting a hovering input are disposed between electrodes for detecting a touch input. Thus, the performance of a touch input may be improved and the accuracy of hovering recognition may be secured, while maintaining the area of a touch sensor.

According to various embodiments, an electronic device and an operating method thereof may be provided in which a dummy electrode in addition to an electrode for detecting a touch input among electrodes included in the touch sensor is connected through a bridge structure for hovering recognition. By using a dummy electrode included in an existing touch sensor for hovering recognition, hovering may be detected without a manufacturing cost for including an additional sensor in the electronic device.

According to various embodiments, an electronic device and an operating method thereof may be provided in which by using one or more dummy electrodes in addition to an electrode for detecting a touch input among electrodes included in the touch sensor, touch recognition accuracy improvement, hovering recognition, grip detection, or proximity detection may be performed.

MODE FOR CARRYING OUT THE INVENTION

Figure 1:
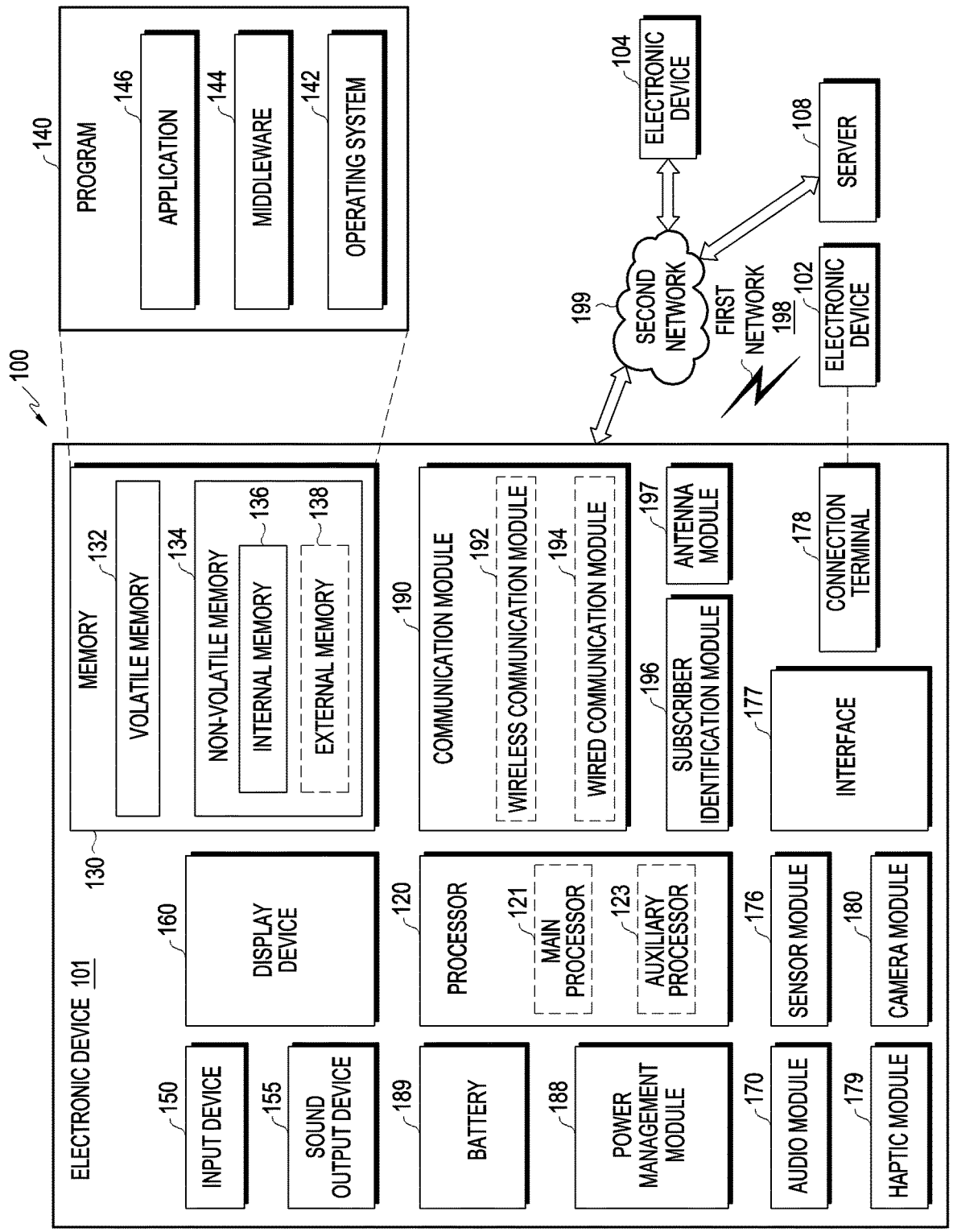
FIG. 1 is a block diagram of an electronic device, which includes a sensor for touch recognition and a sensor for hovering recognition, in a network environment, according to various embodiments of the present disclosure.

FIG. 1 is a block diagram of an electronic device 101, which includes a sensor for touch recognition and a sensor for hovering recognition, in a network environment 100 according to various embodiments of the present disclosure. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as a single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, the hologram device, and the projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal or vice versa. According to an embodiment, the audio module 170 may obtain the sound via the input device 150, or output the sound via the sound output device 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wireless-Fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment of the present disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, when the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
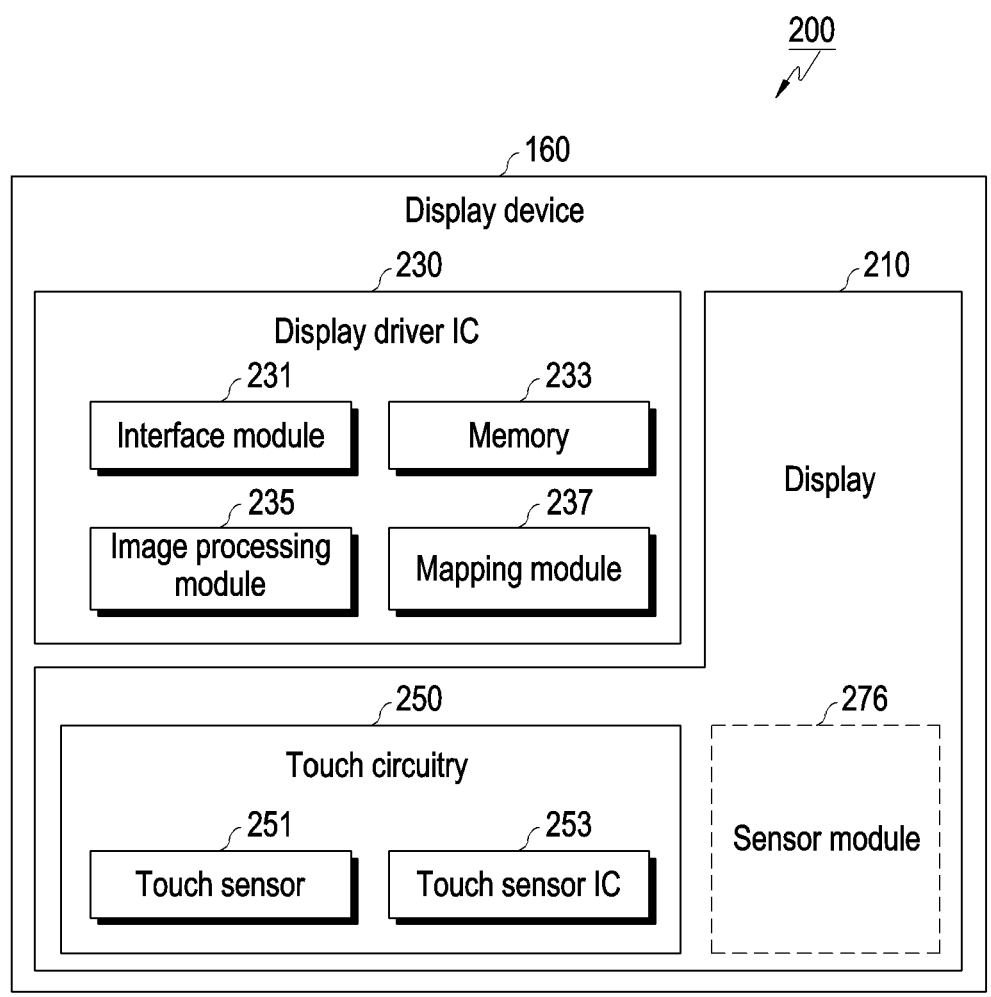
FIG. 2 is a block diagram of a display device, which includes a sensor for touch recognition and a sensor for hovering recognition, according to various embodiments.

FIG. 2 illustrates the display device 160, which includes a sensor for touch recognition and a sensor for hovering recognition, according to various embodiments. Referring to FIG. 2, the display device 160 may include a display 210 and a display driver integrated circuit (IC) (DDI) 230 to control the display 2110. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame-by-frame basis. The image processing module 235 may perform pre-processing or post-processing (e.g., adjustment of resolution, brightness, or size) with respect to at least part of the image data, for example, based at least in part on one or more characteristics of the image data or one or more characteristics of the display 210. The mapping module 237 may generate a voltage value or a current value corresponding to the image data pre-processed or post-processed by the image processing module 135. According to an embodiment, the generating of the voltage value or current value may be performed, for example, based at least in part on one or more attributes of the pixels (e.g., an array, such as an RGB stripe or a pentile structure, of the pixels, or the size of each subpixel) of the display 210. At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to detect a touch input or a hovering input with respect to a certain position on the display 210. For example, the touch sensor IC 253 may detect a touch input or a hovering input by measuring a change in a signal (e.g., a voltage, a quantity of light, a resistance, or a quantity of one or more electric charges) corresponding to the certain position on the display 210. The touch sensor IC 253 may provide information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of the display device 160 (e.g., the display 210 or the DDI 230) or one portion of the touch circuitry 250). For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
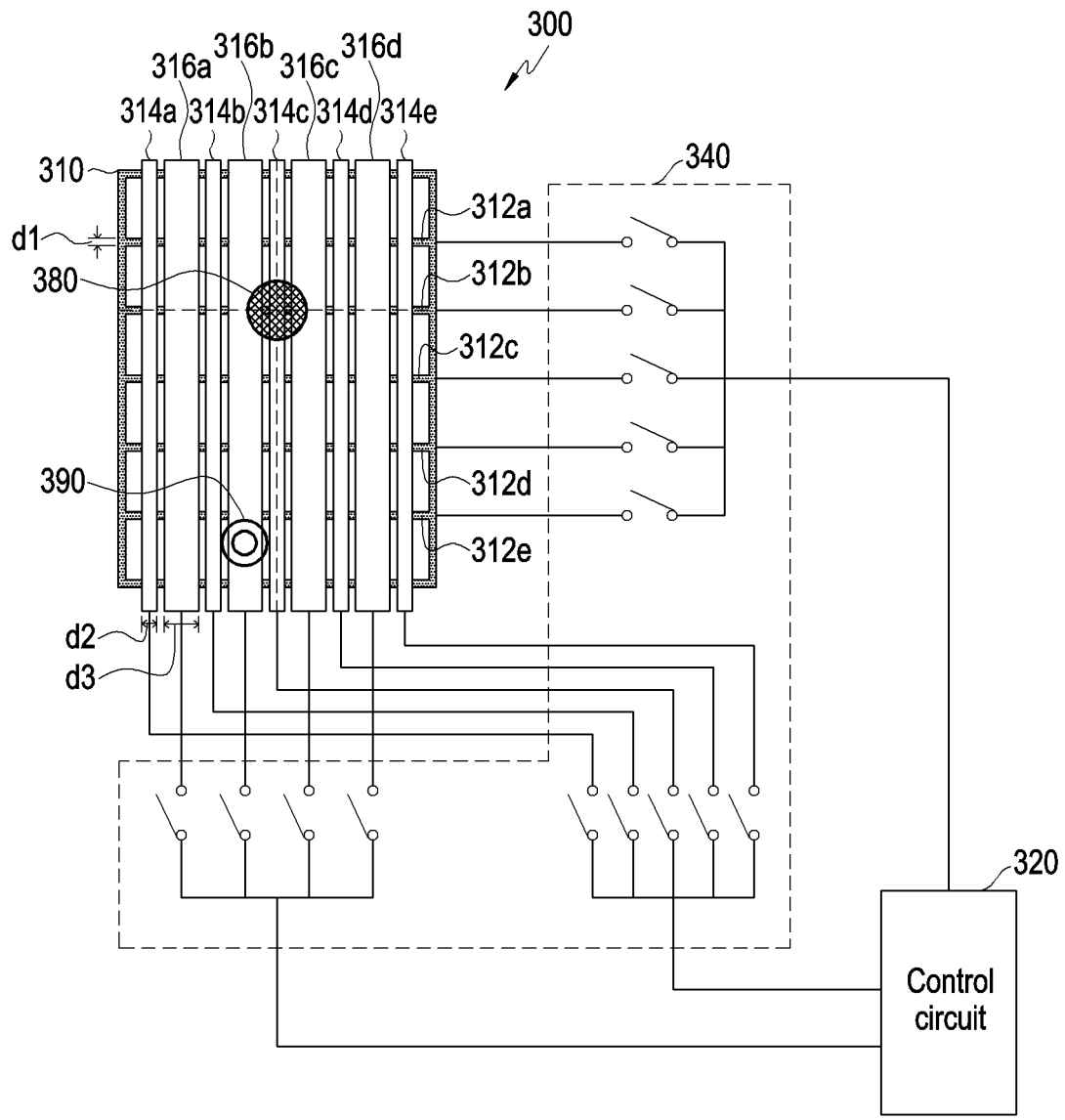
FIG. 3 illustrates a sensor/control circuit that detects a touch input and a hovering input, according to various embodiments.

FIG. 3 illustrates a sensor/control circuit 300 that detects a touch input and a hovering input, according to various embodiments.

The electronic device 101 according to various embodiments may include a sensor 310 (e.g., the touch sensor 251) and a control circuit 320 (e.g., the touch sensor IC 253) which are capable of detecting at least one of a touch input or a hovering input. The control circuit 320 may transmit a driving signal to the sensor 310 or recognize a value detected by the sensor 310. The sensor 310 may include a plurality of electrodes and may be connected with the control circuit 320 through one or more switches 340. The control circuit 320 may control at least one of the one or more switches 340 to transmit a driving signal to at least some of a plurality of electrodes or recognize a value detected by the some electrodes. In various embodiments, the one or more switches 340 may be included in the control circuit 320. In various embodiments, the sensor 310 may be connected with the control circuit 320 through a multiplexer (MUX) (not shown). In various embodiments, the control circuit 320 may be implemented in the touch sensor IC 253, but this is merely an example, and at least some function of the control circuit 320 may be executed by the processor 120 of the electronic device 101. In various embodiments, the electronic device 101 may include the one control circuit 320 for recognizing hovering and touch. The control circuit 320 may detect touch recognition or hovering recognition in a time-divisional manner. For example, the control circuit 320 may detect touch recognition for a first period of a specified time period and may detect hovering recognition for a second period of the specified time period. Alternatively, the electronic device 101 may include a plurality of control circuits 320 for recognizing hovering or touch. For example, a plurality of control circuits 320 may be implemented by including a control circuit for detecting touch recognition and a control circuit for detecting hovering recognition. The one or more electrodes may be controlled such that a first control circuit may detect touch recognition, and a second control circuit may detect hovering recognition.

Figure 7:
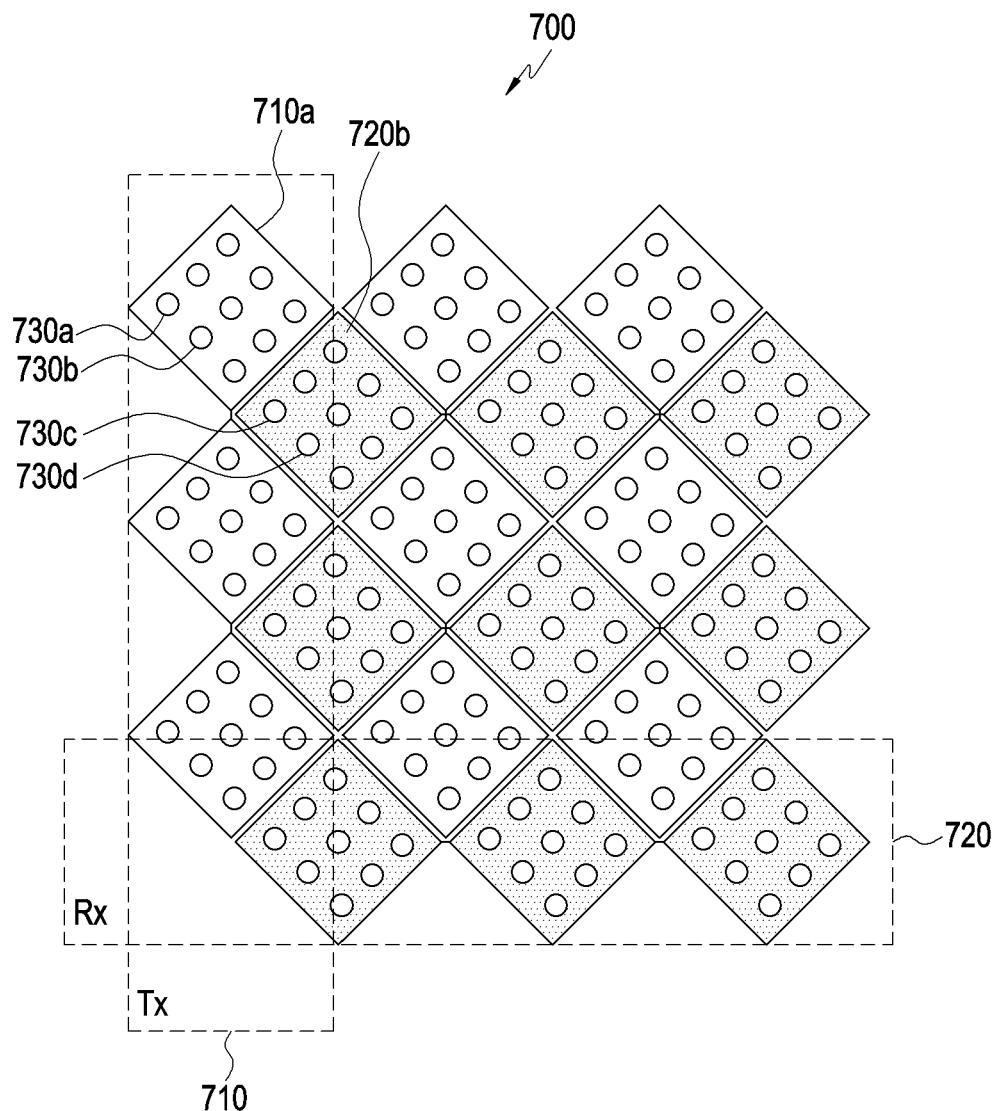
FIG. 7 illustrates a sensor having a youm (Y)-on-cell touch active-matrix organic light-emitting diode (AMO-LED) (OCTA) structure that detects a touch input and a hovering input, according to various embodiments.

The sensor 310 (e.g., the touch sensor 251) may include one or more first electrodes 312a, 312b, 312c, 312d, and 312e, one or more second electrodes 314a, 314b, 314c, 314d, and 314e, and one or more third electrodes 316a, 316b, 316c, and 316d. The one or more first electrodes 312a, 312b, 312c, 312d, and 312e may extend horizontally, and the one or more second electrodes 314a, 314b, 314c, 314d, and 314e, and the one or more third electrodes 316a, 316b, 316c, and 316d may extend vertically. Each of the one or more third electrodes 316a, 316b, 316c, and 316d, when viewed from top, may be disposed on a space between every two of the one or more second electrodes 314a, 314b, 314c, 314d, and 314e. Each of the one or more third electrodes 316a, 316b, 316c, and 316d may be disposed separated by a specified interval from each of the one or more second electrodes 314a, 314b, 314c, 314d, and 314e. A width d3 of each of the third electrodes 316a, 316b, 316c, and 316e may be different from a width d1 of each of the first electrodes 312a, 312b, 312c, 312d, and 312e or a width d2 of each of the second electrodes 314a, 314b, 314c, 314d, and 314e. The width d3 of each of the third electrodes 316a, 316b, 316c, and 316e may be, for example, greater than the width d1 of each of the first electrodes 312a, 312b, 312c, 312d, and 312e or the width d2 of each of the second electrodes 314a, 314b, 314c, 314d, and 314e. In various embodiments, the width d3 of each of the third electrodes 316a, 316b, 316c, and 316e may be the same as the width d1 of each of the first electrodes 312a, 312b, 312c, 312d, and 312e or the width d2 of each of the second electrodes 314a, 314b, 314c, 314d, and 314e. In FIG. 3, an electrode is implemented in the form of a rod, but the shape of the electrode is not limited. For example, as shown in FIG. 7, electrodes may be implemented in the form of a mesh, and the mesh form will be described in more detail later. In addition, the number of electrodes is not limited.

Figure 4:
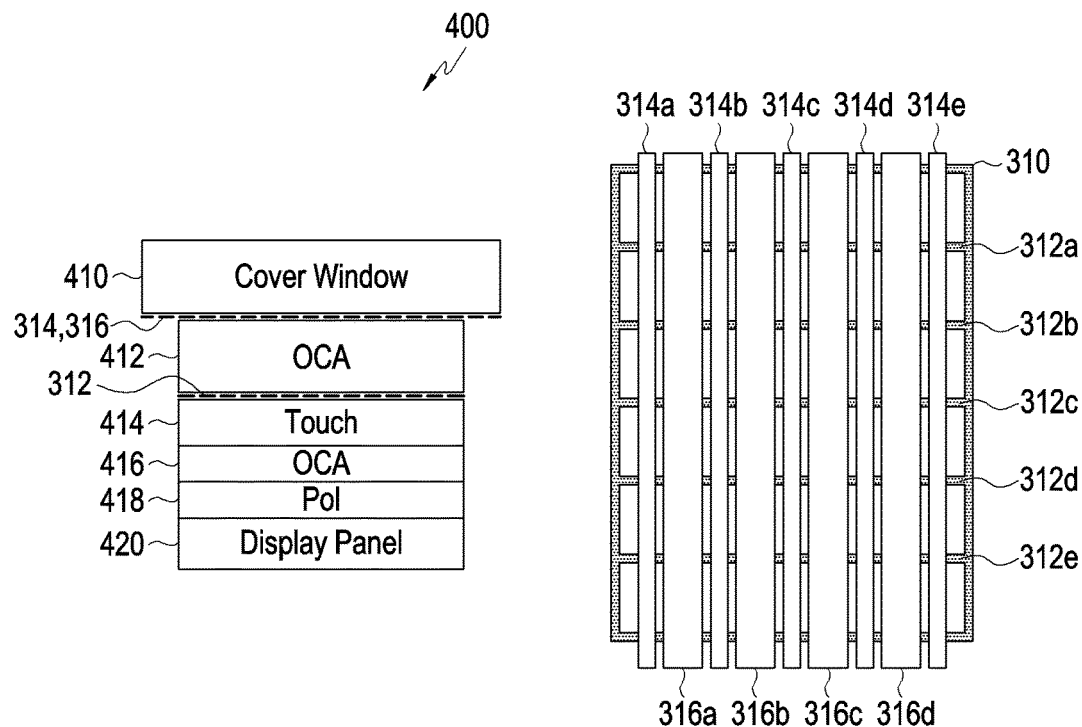
FIGS. 4 and 5 illustrate cross sections of a touch screen including a sensor that detects a touch input and a hovering input, according to various embodiments.
Figure 5:
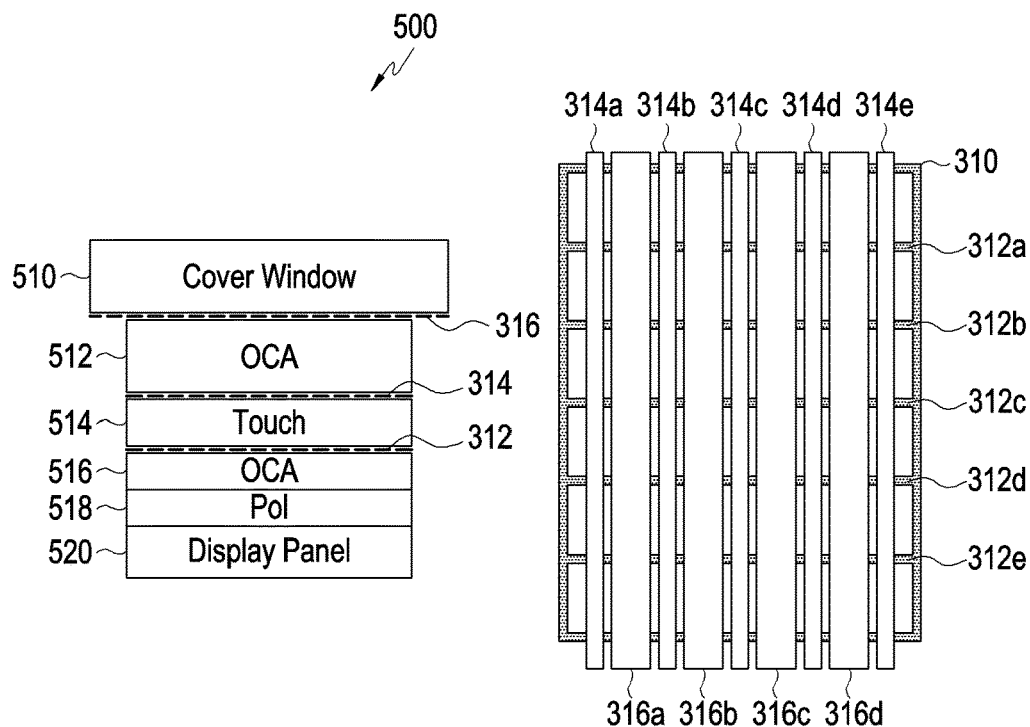

In various embodiments, the sensor 310 may be implemented as a single layer or a plurality of layers. When the sensor 310 is implemented with a single layer, the first electrodes 312a, 312b, 312c, 312d, and 312e, the second electrodes 314a, 314b, 314c, 314d, and 314e, and the third electrodes 316a, 316b, 316c, and 316d may be disposed on a board. In a portion where at least one of the first electrodes 312a, 312b, 312c, 312d, and 312e and at least one of the second electrodes 314a, 314b, 314c, 314d, and 314e overlap each other, an insulating material may be positioned between the overlapping electrodes, and the first electrodes 312a, 312b, 312c, 312d, and 312e or the second electrodes 314a, 314b, 314c, 314d, and 314e may be respectively connected through a bridge. When the sensor 310 is implemented with a plurality of layers, the first electrodes 312a, 312b, 312c, 312d, and 312e may be disposed on the first board, and the second electrodes 314a, 314b, 314c, 314d, and 314e and the third electrodes 316a, 316b, 316c, and 316d may be disposed on a second board supporting the first board. A stacked structure of the sensor 310 may be implemented in various forms. For example, the sensor 310 may be implemented with a structure as shown in FIGS. 4 and 5, and will be described in detail later.

A mutual capacitance may be formed between at least some of the first electrodes 312a, 312b, 312c, 312d, and 312e and at least some of the second electrodes 314a, 314b, 314c, 314d, and 314e. The control circuit 320 may control a driving signal to be output to at least one TX electrode. For example, when at least some of the first electrodes 312a, 312b, 312c, 312d, and 312e are determined as TX electrodes, the control circuit 320 may control the one or more switches 340 to apply the driving signal to the first electrodes 312a, 312b, 312c, 312d, and 312e. The control circuit 320 may identify a mutual capacitance between each of the first electrodes 312a, 312b, 312c, 312d, and 312e and an adjacent electrode (e.g., the electrode 314c), at least based on an electric signal output from the first electrodes 312a, 312b, 312c, 312d, and 312e. The control circuit 320 may sequentially scan electric signals output from the second electrodes 314a, 314b, 314c, 314d, and 314e and convert the scanned electric signals into digital signals. The control circuit 320 may identify a capacitance change corresponding to each of the second electrodes 314a, 314b, 314c, 314d, and 314e at least based on the digital signal, and may identify a touch point, i.e., a coordinate x of the touch point.

The control circuit 320 may determine that a magnitude of the mutual capacitance identified during application of the driving signal to the electrode 312b is different from a previous value before application of a touch 380. The control circuit 320 may determine an intersection between the electrode 312b and the electrode 314c as a position of the touch 380, based on an identified difference. Alternatively, the control circuit 320 may identify the position of the touch 380 by processing electric signals output from the first electrodes 312a, 312b, 312c, 312d, and 312e in a designated manner. While it is illustrated in FIG. 3 that the electronic device 101 identifies the position of the touch 380 based on the mutual capacitance, this is merely an example and those of ordinary skill in the art would easily understand that the electronic device 101 may identify the position of the touch 380 based on a change of a self-capacitance of each electrode, and there is no limitation in a method of identifying a touch position in a capacitive manner.

The electronic device 101 according to various embodiments, when applying a driving signal to a TX electrode, may apply a signal of a magnitude that is substantially the same as that of a driving signal to the third electrodes 316a, 316b, 316c, and 316d, to increase a mutual capacitance difference with an adjacent electrode. For example, when at least some of the first electrodes 312a, 312b, 312c, 312d, and 312e are determined as TX electrodes, the control circuit 320 may apply the driving signal to the first electrodes 312a, 312b, 312c, 312d, and 312e and the third electrodes 316a, 312b, 316b, 316c, and 316d. The control circuit 320 may control at least one of the plurality of switches 340 to apply a driving signal of the same magnitude to the first electrodes 312a, 312b, 312c, 312d, and 312e and the third electrodes 316a, 312b, 316b, 316c, and 316d. Thus, when the driving signal is to the first electrodes 312a, 312b, 312c, 312d, and 312e and the third electrodes 316a, 312b, 316b, 316c, and 316d, touch sensitivity may be improved in comparison to when the driving signal is applied to the first electrodes 312a, 312b, 312c, 312d, and 312e.

The electronic device 101 according to various embodiments may maintain high impedance in the third electrodes 316a, 312b, 316b, 316c, and 316d, while applying the driving signal to the TX electrode. Thus, it is possible to remove interference which may occur due to the third electrodes 316a, 312b, 316b, 316c, and 316d in measurement of a mutual capacitance between a TX electrode and an RX electrode.

The electronic device 101 according to various embodiments may detect a hovering input related to an external object by using the third electrodes 316a, 316b, 316c, and 316d. For example, the control circuit 320 may identify a position of hovering 390 based on a change of each self-capacitance, by applying the driving signal to the third electrodes 316a, 312b, 316b, 316c, and 316d using the plurality of switches 340. The electronic device 101 may identify a touch position by performing driving signal application and scanning with respect to the first electrodes 312a, 312b, 312c, 312d, and 312e and the second electrodes 314a, 314b, 314c, 314d, and 314e. Thereafter, the electronic device 101 may identify information about the hovering 390 by performing scanning on at least some of the third electrodes 316a, 312b, 316b, 316c, and 316d. The control circuit 320 may sequentially scan the third electrodes 316a, 312b, 316b, 316c, and 316d, convert scanning results into digital signals, and identify the information about the hovering 390 at least based on the digital signals. The TX electrode during scanning of each of the third electrodes 316a, 312b, 316b, 316c, and 316d may be at least some of the first electrodes 312a, 312b, 312c, 312d, and 312e or the second electrodes 314a, 314b, 314c, 314d, and 314e.

FIGS. 4 and 5 illustrate cross sections 400 and 500 of a touch screen including a sensor that detects a touch input and a hovering input, according to various embodiments.

The electronic device 101 according to various embodiments may include a touch screen (e.g., the display device 160). The touch screen 160 may be implemented by including the sensor 310 that detects a touch input and a hovering input. The touch screen 160 may include a cover window, a touch board, a display panel, and film layers among the cover window, the touch board, and the display panel. For example, referring to FIGS. 4 and 5, from top to down, there may be cover windows 410 and 510, first film layers 412 and 512 (e.g., optically clear adhesives (OCAs)), touch boards 414 and 514, second film layers 416, 418, 516, and 518 (e.g., OCAs and polarizers (Pol)), and display panels 420 and 520. The cover windows 410 and 510 may be made of glass or polymer.

Referring to FIG. 4, the sensor 310 for detecting a touch input and a hovering input may include the one or more first electrodes 312a, 312b, 312c, 312d, and 312e (hereinafter, '312'), the one or more second electrodes 314a, 314b, 314c, 314d, and 314e (hereinafter, '314'), and the one or more third electrodes 316a, 316b, 316c, and 316d (hereinafter, '316'). The first electrodes 312 and the second electrodes 314 may be disposed orthogonal to each other, and the third electrodes 316 may be disposed orthogonal to the first electrodes 312 and may be disposed separated by a specified interval from the second electrodes 314 on the same plane as the second electrodes 314. For example, referring to FIG. 4, the second electrodes 314 and the third electrodes 316 may be disposed under the cover window 410 and the first electrodes 312 may be disposed on the touch board 414.

In another embodiment, referring to FIG. 5, the first electrodes 312 and the second electrodes 314 may be disposed orthogonal to each other, and the third electrodes 316 may be disposed orthogonal to the first electrodes 312 and may be disposed separated by a specified interval from the second electrodes 314 on a layer that is different from those of the first electrodes 312 and the second electrodes 314. For example, referring to FIG. 5, the first electrodes 312 may be disposed on the touch board 514, the second electrodes 314 may be disposed under the touch board 514, and the third electrodes 316 may be disposed under the cover window 510. In another example, the first electrodes 312 and the second electrodes 314 may operate as TX electrodes and RX electrodes on a touch board (not shown), and may be disposed together in the form of a bridge on a touch board (not shown). In another example, a touch electrode (not shown) in which the first electrodes 312 operating as TX electrodes are disposed and a touch electrode (not shown) in which the second electrodes 314 operating as RX electrodes are disposed may be included. In another example, a touch electrode (not shown) may be disposed under the second film layer 518 or a touch electrode (not shown) may be disposed on the display panel 520. In another example, a touch electrode (not shown) may be included in the display panel 520. FIGS. 4 and 5 show examples in which the first electrodes 312, the second electrodes 314, and the third electrodes 316 may be implemented variously in the same layer or different layers according to an add-on scheme, an on-cell scheme, or an in-cell scheme.

Figure 6:
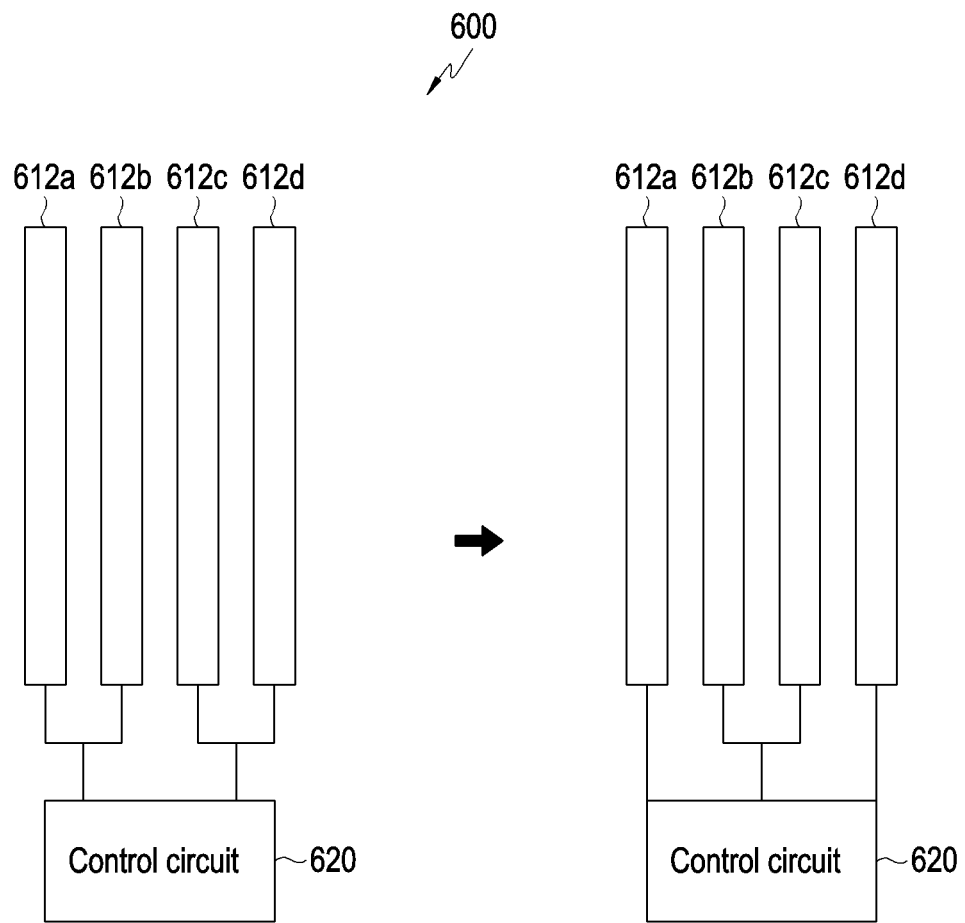
FIG. 6 illustrates a connection structure of electrodes that detect a hovering input, according to various embodiments.

FIG. 6 illustrates a connection structure of electrodes that detect a hovering input, according to various embodiments.

The electronic device 101 according to various embodiments may detect a hovering input by connecting two or more of one or more electrodes. The electronic device 101 may include one or more electrodes 612a, 612b, 612c, and 612d, and a control circuit 620 (e.g., the control circuit 320) may connect at least some of the one or more 612a, 612b, 612c, and 612d by using at least one switch (not shown). For example, the control circuit 620 may connect the electrode 612a with the electrode 612b and the electrode 612c with the electrode 612d. Alternatively, the control circuit 620 may connect the electrode 612b with the electrode 612c. The control circuit 620 may sequentially connect every two of a plurality of electrodes, and for example, the control circuit 620 may connect an odd-number electrode with an even-number electrode in order in which the plurality of electrodes are disposed, or alternately connect an even-number electrode with an odd-number electrode. The number of electrodes connected by the control circuit 620 is not limited, and electrodes of a number determined appropriately for the electronic device 101 may be connected for an operation. The control circuit 620 may detect a touch input or a hovering input based on a change of a self-capacitance of each of the one or more electrodes 612a, 612b, 612c, and 612d. Alternatively, the control circuit 620 may detect a touch input or a hovering input based on a mutual capacitance between each of the one or more electrodes 612a, 612b, 612c, and 612d and adjacent one or more electrodes (not shown).

FIG. 7 illustrates a sensor 700 having a youm (Y)-on-cell touch active-matrix organic light-emitting diode (AMOLED) (OCTA) structure that detects a touch input and a hovering input, according to various embodiments.

A sensor (e.g., the sensor 320) that detects at least one of a touch input or a hovering input, which is included in an electronic device (e.g., the electronic device 101) according to various embodiments may be implemented with an OCTA, and in this case, the sensor may be directly deposited on or over an AMOLED display. In another example, the sensor 320 may be implemented with a Y-OCTA, and in this case, the sensor 320 may be directly deposited on or over a flexible AMOLED display. In another example, the sensor 310 may be deposited inside the display panel. Referring to FIG. 7, the sensor 700 of the Y-OCTA structure is illustrated.

The sensor 700 of the Y-OCTA structure may include an electrode in the form of a metal mesh. For example, the sensor 700 may include a first node 710a including one or more first electrodes (not shown) in the form of a metal mesh or a second node 720b including one or more second electrodes (not shown) in the form of a metal mesh. The first node 710a may operate as a TX electrode 710 by being connected with an adjacent node including one or more first electrodes. The second node 720b may operate as an RX electrode 720 by being connected with an adjacent node including one or more second electrodes.

One or more third electrodes may be included in the first node 710a or the second node 720b. For example, the first node 710a may include one or more third electrodes 730a and 730b, and the second node 720b may include one or more third electrodes 730c and 730d. The one or more third electrodes 730a, 730b, 730c, and 730d may be connected to one another, and connected third electrodes may operate as one electrode. The first node 710a and the second node 720b may be disposed on the same layer, and the one or more electrodes 730a, 730b, 730c, and 730d included in the first node 710a or the second node 720b may be connected to one another through at least one bridge included in an adjacent layer.

The electronic device 101 according to various embodiments may include a control circuit (e.g., the control circuit 320), and the control circuit 320 may detect a touch input or a hovering input by using the sensor 700.

The control circuit 320 may detect touch information generated by an input with respect to the external object, based on a change of a capacitance between at least some of the one or more first electrodes and at least some of the one or more second electrodes. The control circuit 320 may apply a driving signal of a first magnitude to first electrodes and measure capacitances of the first electrodes and an electrode adjacent to the first electrodes. In various embodiments, the control circuit 320, while applying the driving signal of the first magnitude to the first electrodes, may apply a driving signal of the same magnitude to third electrodes, thereby increasing a mutual capacitance difference.

The control circuit 320 may detect hovering information based on a capacitance of at least some of the one or more third electrodes 730a, 730b, 730c, and 730d. The control circuit 320 may measure a change of each self-capacitance at least based on a magnitude of an electric signal output from the one or more third electrodes 730a, 730b, 730c, and 730d, in response to application of a signal of a specified magnitude to at least some of the first electrodes or the second electrodes. The control circuit 320 may identify the position of hovering based on the measured change of the self-capacitance.

In various embodiments, the electronic device 101 may use at least one switch (not shown) to maintain a specified-range impedance of the third electrodes or apply a driving signal of the same magnitude as that of the driving signal applied to the first electrodes or the second electrodes. For example, at least one switch may be disposed to be connected to at least some of the third electrodes. The electronic device 101 may control some of the third electrodes to operate independently according to a position of a switch.

Figure 8A:
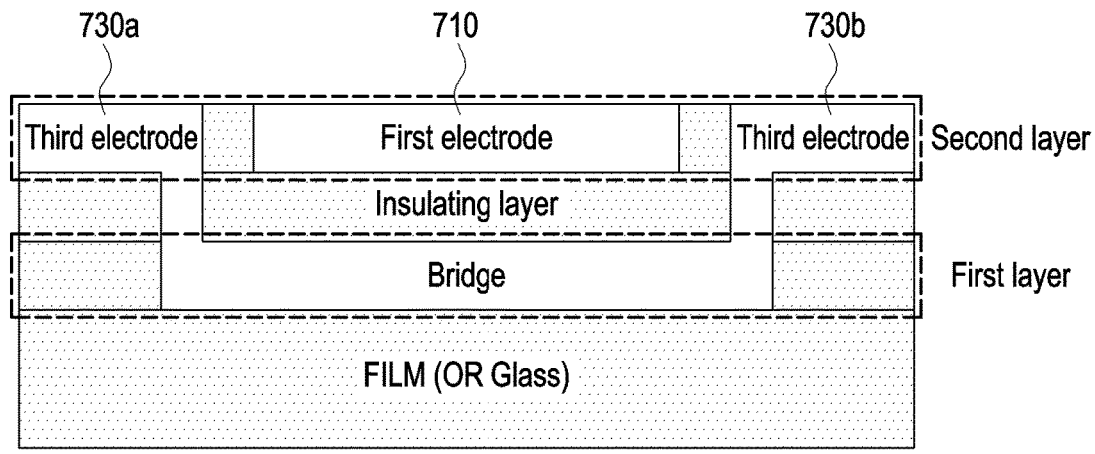
FIGS. 8A and 8B illustrate a connection structure of electrodes that detect a hovering input, according to various embodiments.
Figure 8B:
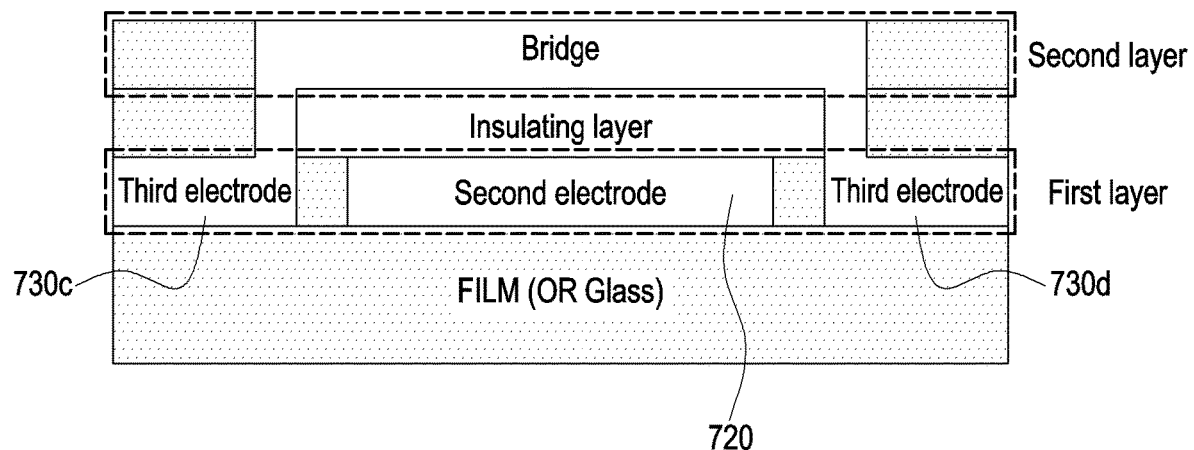

FIGS. 8A and 8B illustrate a connection structure of electrodes that detect a hovering input, according to various embodiments.

The electronic device (e.g., the electronic device 101) according to various embodiments may include one or more first electrodes, one or more second electrodes, and one or more third electrodes, and detect a touch input or a hovering input. In the touch sensor of the Y-OCTA structure, nodes including one or more first electrodes may be connected to one another, and nodes including one or more second electrodes may be connected to one another. The first electrodes, the second electrodes, and the third electrodes may be disposed on a substrate layer (e.g., glass) or a film layer (e.g., an indium tin oxide (ITO) film). The one or more third electrodes may be disposed on a node including first electrodes or a node including second electrodes, and may be connected to operate. Referring to FIGS. 8A and 8B, the third electrodes 730a and 730b included in a first node indicated in FIG. 8A including the one or more first electrodes 710 may be connected through a bridge. For example, the first electrode 710 and the third electrodes 730a and 730b may be disposed on a second layer, and the third electrode 730a and the third electrode 730b may be connected to each other through a bridge of a first layer adjacent to the second layer. An insulating material may exist between the first electrode 710 and the third electrodes 730a and 730b, and an insulating layer formed of an insulating material may be disposed between the second layer and the first layer. In another embodiment, the third electrodes 730c and 730d included in a second node indicated in FIG. 8B including the one or more second electrodes 720 may be connected through a bridge. For example, the second electrode 720 and the third electrodes 730c and 730d may be disposed on the first layer, and the third electrode 730c and the third electrode 730d may be connected to each other through a bridge of the second layer adjacent to the first layer. An insulating material may exist between the second electrode 720 and the third electrodes 730c and 730d, and an insulating layer formed of an insulating material may be disposed between the first layer and the second layer.

Figure 9A:
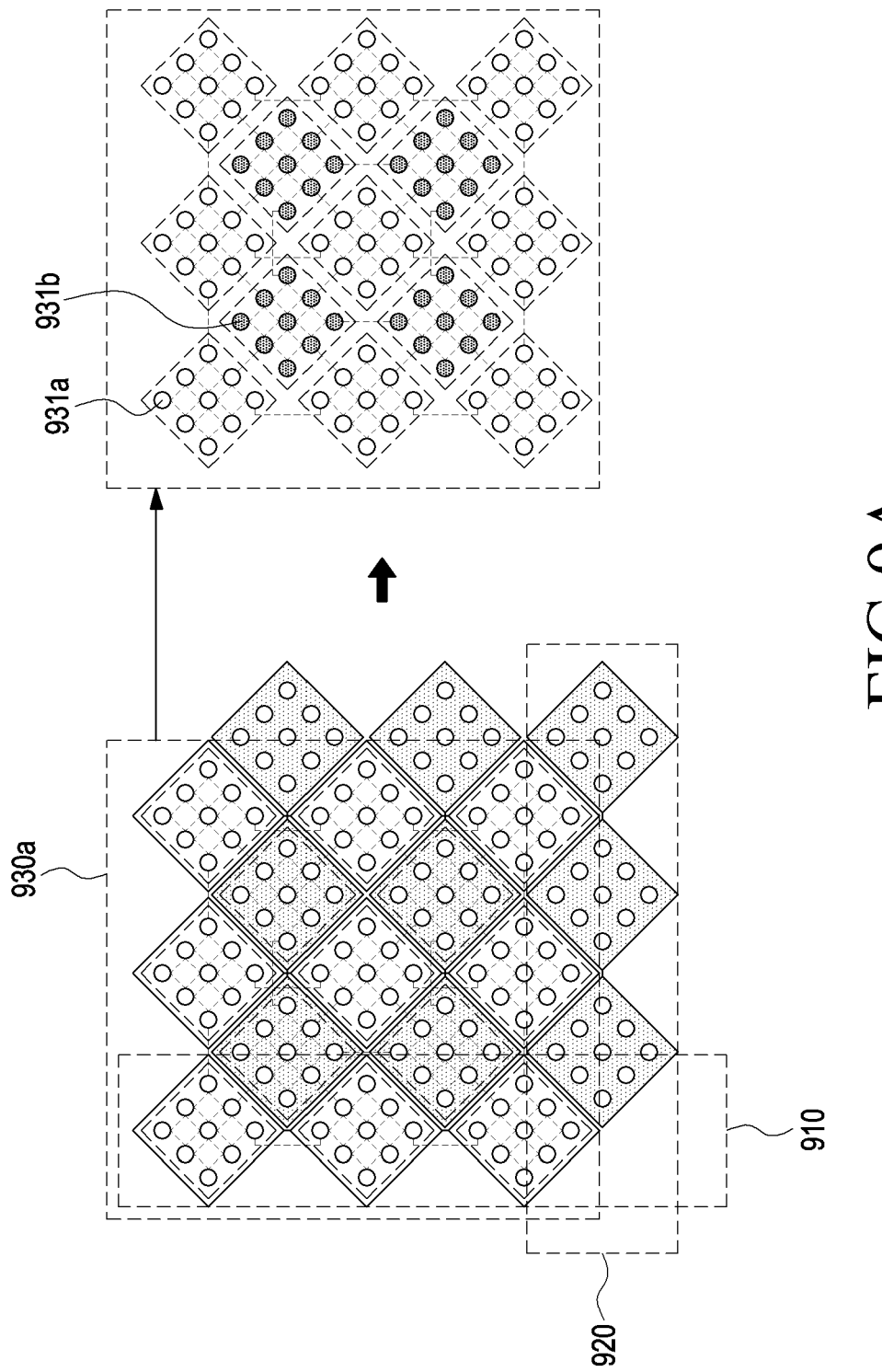
FIGS. 9A to 9C illustrate a type of a hovering sensor according to various embodiments.
Figure 9B:
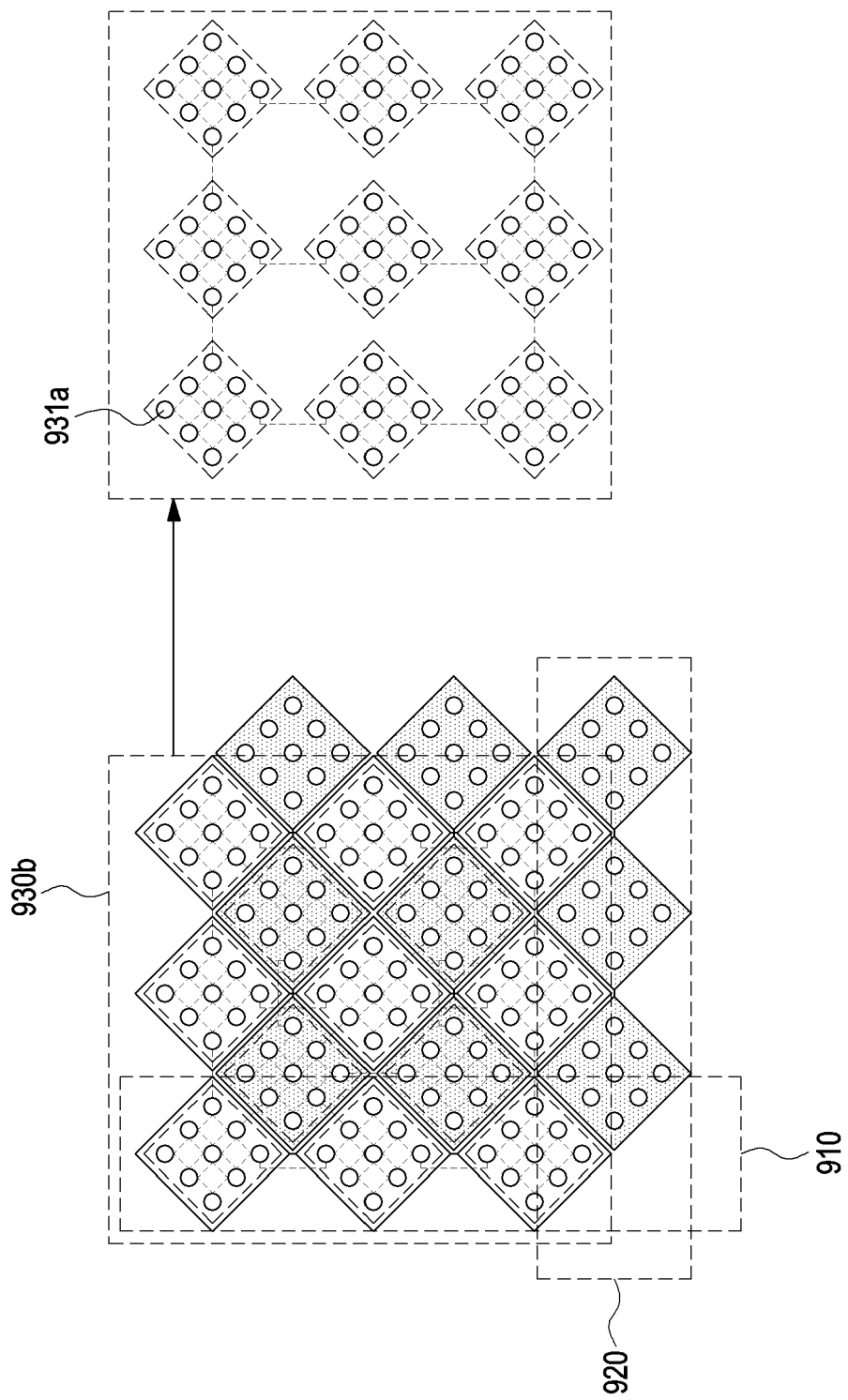
Figure 9C:
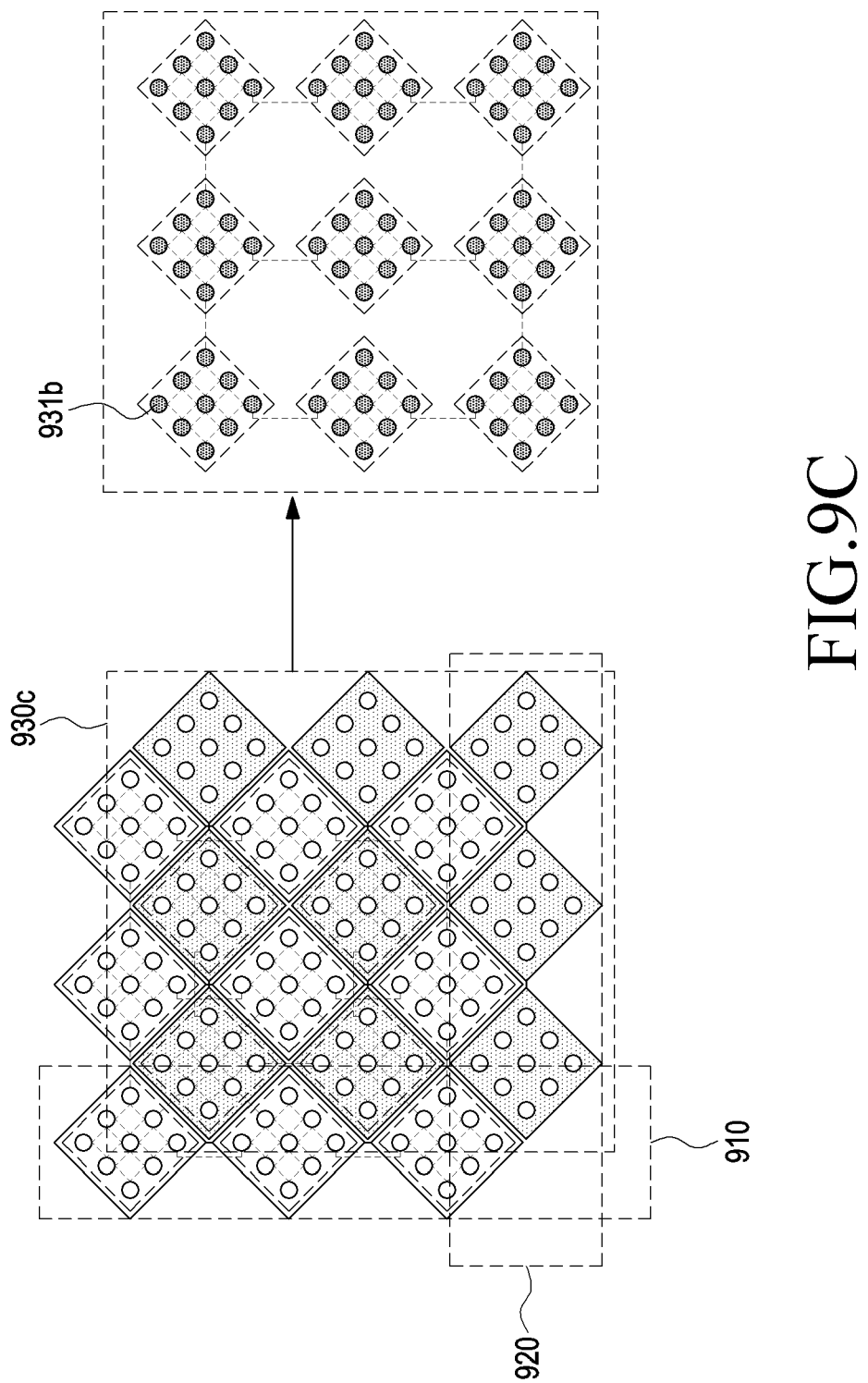

FIGS. 9A through 9C illustrate a type of a hovering sensor according to various embodiments. Referring to FIGS. 9A through 9C, the sensor having the Y-OCTA structure may include first nodes 910 including first electrodes (not shown), second nodes 920 including second electrodes (not shown), and third electrodes. In the sensor having the Y-OCTA structure, the first nodes 910 may include the first electrodes and the third electrodes, and the second nodes 920 may include the second electrodes and the third electrodes.

The electronic device 101 according to various embodiments may include (e.g., use) the third electrodes included in any node to detect a hovering input. For example, referring to FIG. 9A, third electrodes 930a may include one or more third electrodes 931a included in a first node 910 including first electrodes and one or more third electrodes 931b included in a second node 920 including second electrodes.

Alternatively, the electronic device 101 according to various embodiments may select some of all nodes including first electrodes or second electrodes to connect third electrodes included in the selected node and use the connected third electrodes as a sensor for detecting a hovering input. For example, referring to FIG. 9B, third electrodes 930b included in the first nodes 910 including first electrodes may be connected to constitute a sensor. The third electrodes 930b may include the third electrode 931a included in the first node 910 including the first electrodes. In another example, referring to FIG. 9C, third electrodes 930c included in the second nodes 920 including second electrodes may be connected to constitute a sensor. The third electrodes 930c may include the third electrode 931b included in the second node 920 including the second electrodes.

Figure 10:
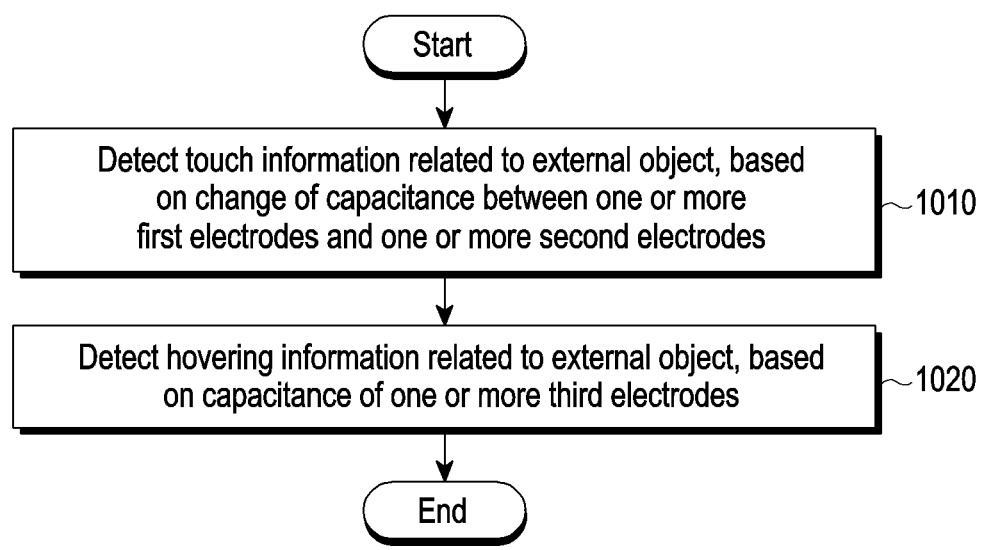
FIG. 10 is a flowchart of an operating method of an electronic device according to various embodiments.

FIG. 10 is a flowchart of an operating method of an electronic device according to various embodiments.

According to various embodiments, the electronic device 101 (e.g., the control circuit 320) may detect touch information related to an external object, based on a change of a capacitance between one or more first electrodes (e.g., the first electrodes 312a, 312b, 312c, 312d, and 312e of FIG. 3) and one or more second electrodes (e.g., the second electrodes 314a, 314b, 314c, 314d, and 314e of FIG. 3), in operation 1010. The electronic device 101 may detect touch information related to an external object, based on a change of a capacitance between at least some of the one or more first electrodes 312a, 312b, 312c, 312d, and 312e and at least some of the one or more second electrodes 314a, 314b, 314c, 314d, and 314e, when a second signal of the same magnitude as that of a first signal applied to the one or more first electrodes 312a, 312b, 312c, 312d, and 312e or the one or more second electrodes 314a, 314b, 314c, 314d, and 314e is applied to one or more third electrodes (e.g., the third electrodes 316a, 316b, 316c, and 316d of FIG. 3). In various embodiments, the electronic device 101 may maintain an impedance in a specified range in the third electrodes when the first signal is applied to the first electrodes or the second electrodes. For example, when a high impedance is maintained in the third electrodes, the third electrodes do not operate, thereby removing interference that may occur when detecting a touch input using the first electrodes and the second electrodes.

The electronic device 101 (e.g., the control circuit 320) may detect hovering information related to an external object based on a capacitance of the one or more third electrodes 316a, 316b, 316c, and 316d, in operation 1020. The electronic device 101 may detect the hovering information based on a capacitance of at least one of the one or more third electrodes when the first signal is applied to the first electrodes or the second electrodes. In various embodiments, the electronic device 101 may measure a magnitude of an electric signal from at least some of the third electrodes when at least some of a plurality of lines formed by the third electrodes are connected to operate, thereby detecting a capacitance. In various embodiments, the electronic device 101 may measure a change of a capacitance between at least some of the one or more first electrodes and at least some of the one or more second electrodes for the first period of the specified time period, and measure a capacitance of at least some of the one or more third electrodes for the second period of the specified time period.

Figure 11:
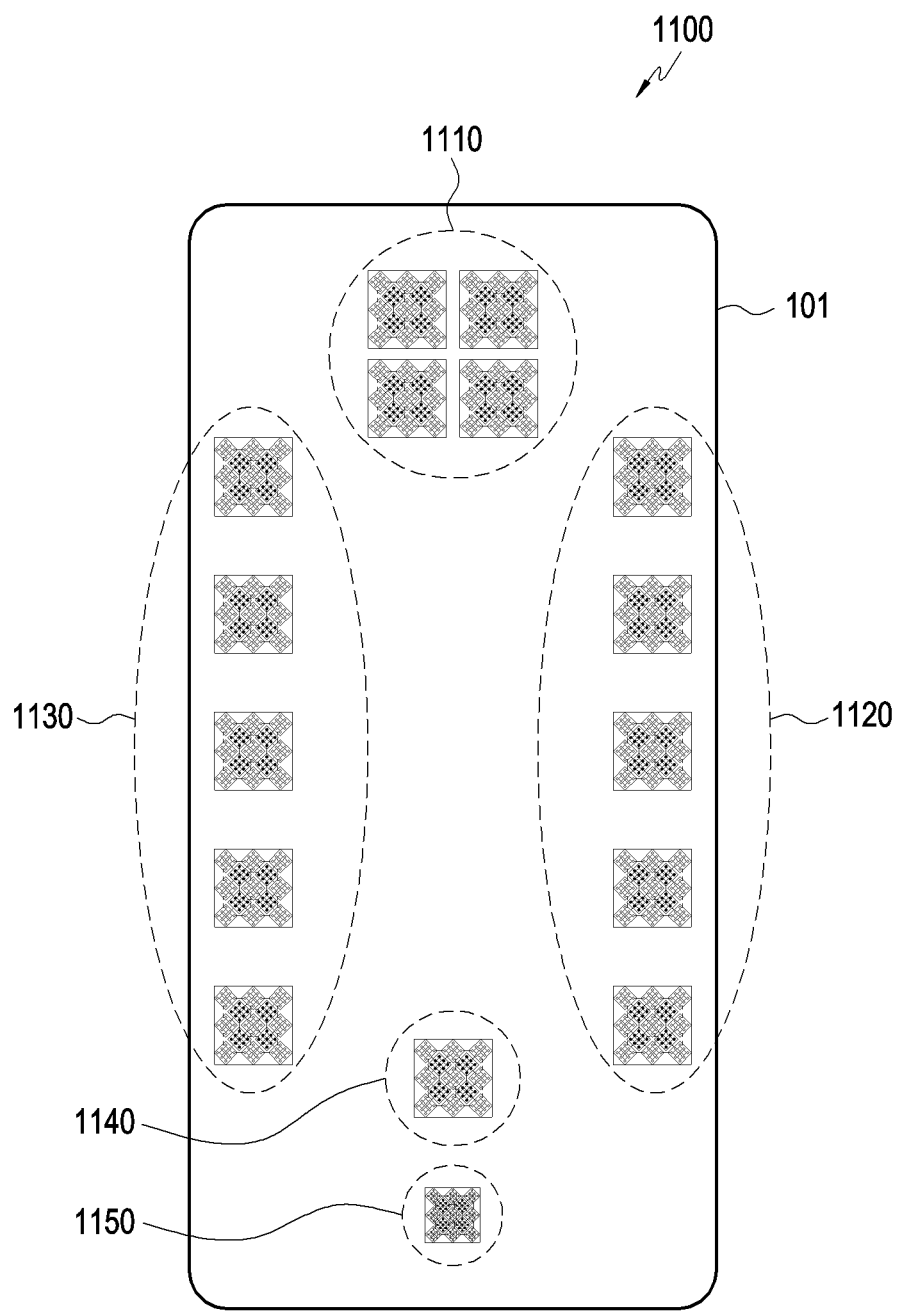
FIG. 11 illustrates a sensor for various purposes included in an electronic device according to various embodiments.

FIG. 11 illustrates a sensor 1100 for various purposes included in an electronic device according to various embodiments.

The electronic device 101 according to various embodiments may use a sensor, configured by connecting one or more third electrodes (e.g., the third electrodes 930a of FIG. 9A, the third electrodes 930b of FIG. 9B, or the third electrodes 930c of FIG. 9C) included in a first node (e.g., the first node 710 of FIG. 7) including one or more first electrodes or a second node (e.g., the second node 720 of FIG. 7) including one or more second electrodes, for various purposes. The electronic device 101 may detect a touch input by using one or more first electrodes and one or more second electrodes, and detect proximity, grip, and hovering by further using one or more third electrodes. Referring to FIG. 11, the electronic device 101 may include one or more first electrodes, one or more second electrodes, and one or more third electrodes in each of a first region 1110, a second region 1120, a third region 1130, a fourth region 1140, and a fifth region 1150.

The electronic device 101 may detect proximity by using the first electrodes, the second electrodes, and the third electrodes included in the first region 1110. For example, when the electronic device 101 is in communication, the electronic device 101 may determine whether a part of a body of a user is proximate to the first region 1110, based on a capacitance of at least some of the third electrodes included in the third region 1110.

The electronic device 101 may detect grip by using the first electrodes, the second electrodes, and the third electrodes included in the second region 1120 and the third region 1130. For example, the electronic device 101 may determine whether the second region 1120 or the third region 1130 is gripped by a part of the body of the user, based on a capacitance of at least some of the third electrodes included in the second region 1120 and the third region 1130.

The electronic device 101 may detect a fingerprint by using the first electrodes, the second electrodes, and the third electrodes included in the fourth region 1140, and may detect a touch input to a home key button by using the first electrodes, the second electrodes, and the third electrodes included in the fifth region 1150.

Figure 12A:
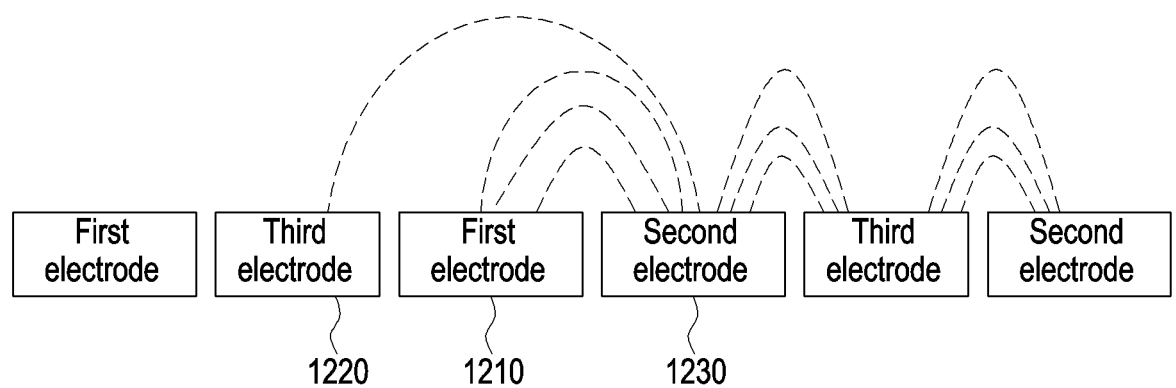
FIGS. 12A and 12B illustrate an operation state of a touch sensor according to various embodiments.
Figure 12B:
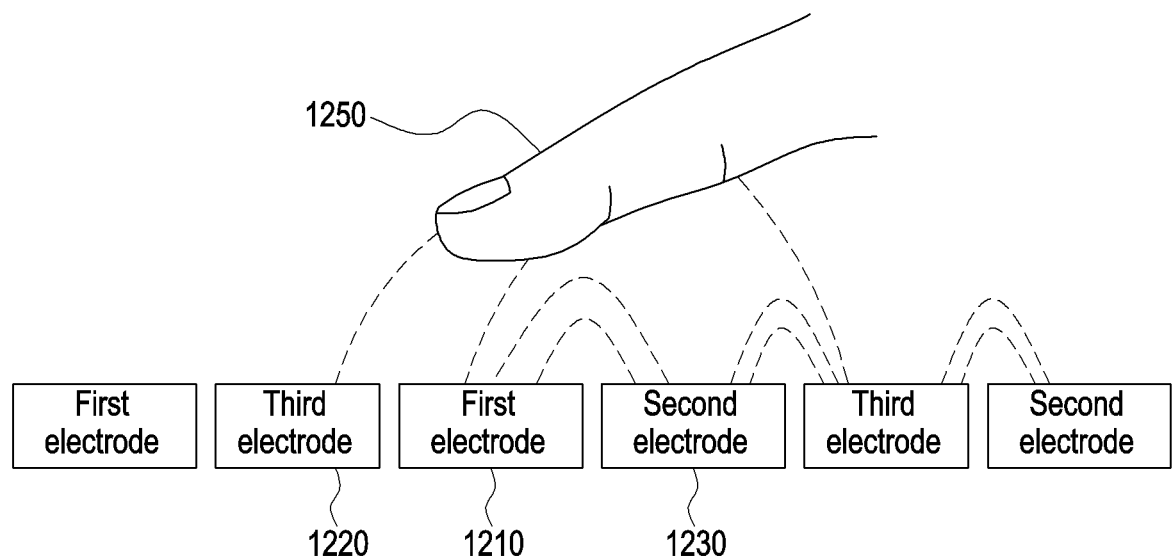

FIGS. 12A and 12B illustrate an operation state of a touch sensor according to various embodiments.

The electronic device 101 according to various embodiments may apply a driving signal of the same magnitude as that of a driving signal applied to a first electrode 1210 to one or more third electrodes 1220 while applying a driving signal to some first electrode 1210 determined as a TX electrode among one or more first electrodes 1210. When the electronic device 101 applies a driving signal to the first electrode 1210 and the third electrode 1220, a capacitance of an adjacent second electrode 1230 may be as indicated in FIG. 12A. When a body part 1250 of the user is close to the electronic device 101, a capacitance of the second electrode 1230 based on the driving signal applied to the first electrode 1210 and the third electrode 1220 may be as indicated in FIG. 12B.

According to various embodiments, the electronic device 101 may include one or more first electrodes, one or more second electrodes disposed in a direction that is at least different from a direction of the one or more first electrodes, one or more third electrodes, when viewed from top, disposed between the one or more second electrodes in a direction that is the same as the direction of the one or more second electrodes, and a control circuit, in which the control circuit is configured to detect touch information related to an external object, at least based on a change of a capacitance between at least some first electrode of the one or more first electrodes and at least some second electrode of the one or more second electrodes and to detect hovering information related to the external object, at least based on a capacitance related to at least some third electrode of the one or more third electrodes.

According to various embodiments, the one or more third electrodes may be disposed separated by a specified interval from each of the one or more second electrodes.

According to various embodiments, the electronic device may further include a substrate layer, in which the one or more first electrodes support the substrate layer, and the one or more second electrodes and the one or more third electrodes are disposed on the substrate layer, or the one or more first electrodes and the one or more second electrodes support the substrate layer and the one or more third electrodes are disposed on the substrate layer.

According to various embodiments, the control circuit may be configured to detect the change of the capacitance between the at least some first electrode and the at least some second electrode while maintaining an impedance in a specified range in the one or more third electrodes.

According to various embodiments, the control circuit may be configured to detect the change of the capacitance between the at least some first electrode and the at least some second electrode while applying, to the one or more third electrodes, a second signal of a magnitude that is substantially the same as a magnitude of a first signal applied to the one or more first electrodes or the one or more second electrodes.

According to various embodiments, the control circuit may be configured to detect the capacitance related to the at least some third electrode in response to applying a signal of a specified magnitude to at least some of the one or more first electrodes or the one or more second electrodes.

According to various embodiments, the control circuit may be configured to measure the change of the capacitance between the at least some first electrode and the at least some second electrode for a first period of a specified time period, and to measure the capacitance related to the at least some third electrode for a second period of the specified time period.

According to various embodiments, the control circuit may be configured to control at least one switch to operate by connecting at least some of a plurality of lines formed by the one or more third electrodes.

According to various embodiments, a width of the one or more third electrodes may be greater than a width of at least one of the one or more first electrodes or the one or more second electrodes.

According to various embodiments, an operating method of the electronic device 101 which includes one or more first electrodes, one or more second electrodes disposed in a direction that is at least different from a direction of the one or more first electrodes, and one or more third electrodes, when viewed from top, disposed between the one or more second electrodes in a direction that is the same as the direction of the one or more second electrodes, may include detecting touch information related to an external object, at least based on a change of a capacitance between at least some first electrode of the one or more first electrodes and at least some second electrode of the one or more second electrode while applying, to the third electrodes, a second signal of a magnitude that is the same as a magnitude of a first signal applied to the first electrodes or the second electrodes, and detecting hovering information related to the external object, at least based on a capacitance related to at least some third electrode of the one or more third electrodes while applying the first signal to the first electrodes or the second electrodes.

According to various embodiments, at least a part of the operation of detecting the touch information related to the external object may include detecting the change of the capacitance between the at least some first electrode and the at least some second electrode when applying the first signal to the one or more first electrodes or the one or more second electrodes and maintaining a specified impedance in the one or more third electrodes.

According to various embodiments, at least a part of the operation of detecting the hovering information related to the external object may include detecting the capacitance related to the at least some third electrode when at least some of a plurality of lines formed by the one or more third electrodes are connected to operate.

According to various embodiments, the operating method may include measuring the change of the capacitance between the at least some first electrode and the at least some second electrode for a first period of a specified time period, and measuring the capacitance related to the at least some third electrode for a second period of the specified time period.

According to various embodiments, the electronic device 101 may include one or more first electrodes included in at least a part of a first node, one or more second electrodes included in at least a part of a second node, one or more third electrodes included in at least a part of the first node or the second node and disposed by being connected to each other, and a control circuit, in which the control circuit is configured to detect touch information related to an external object, at least based on a change of a capacitance between at least some first electrode of the one or more first electrodes and at least some second electrode of the one or more second electrodes and to detect hovering information related to the external object, at least based on a capacitance related to at least some third electrode of the one or more third electrodes.

According to various embodiments, the first node and the second node may be disposed on a first layer, and the one or more third electrodes may be connected to each other through at least one bridge included in a second layer that is adjacent to the first layer.

According to various embodiments, the control circuit may be configured to determine at least one of proximity to the electronic device 101, grip of the electronic device 101, a touch input to the electronic device 101, or occurrence of hovering with respect to the electronic device 101, based on positions in which the one or more third electrodes are disposed on the electronic device 101.

According to various embodiments, the control circuit may be configured to detect the change of the capacitance between the at least some first electrode and the at least some second electrode while maintaining an impedance in a specified range in the one or more third electrodes.

According to various embodiments, the control circuit may be configured to detect the change of the capacitance between the at least some first electrode and the at least some second electrode while applying, to the one or more third electrodes, a second signal of a magnitude that is substantially the same as a magnitude of a first signal applied to the one or more first electrodes or the one or more second electrodes.

According to various embodiments, the control circuit may be configured to measure the change of the capacitance between the at least some first electrode and the at least some second electrode for a first period of a specified time period, and to measure the capacitance related to the at least some third electrode for a second period of the specified time period.

According to various embodiments, the control circuit may be configured to independently operate one or more third electrodes included in the first node and one or more third electrodes included in the second node, by using at least one switch.

The electronic device according to various embodiments disclosed herein may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with,"

"coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. When distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a sensor comprising a first node and a second node; and
   a control circuit,
   wherein the first node includes first electrodes and a part of third electrodes in a form of a metal mesh, and is operated as transmission electrodes,
   wherein the second node includes second electrodes and another part of the third electrodes in a form of a metal mesh, and is operated as reception electrodes,
   wherein the control circuit is configured to:
      detect touch information related to an external object, at least based on a change of a capacitance between at least some first electrode of the first electrodes and at least some second electrode of second electrodes, and
      detect hovering information related to the external object, at least based on a capacitance related to at least some third electrode of the third electrodes,
   wherein the first node and the second node are disposed on a first layer, and
   wherein the third electrodes are connected to each other through at least one bridge included in a second layer that is adjacent to the first layer.

2. The electronic device of claim 1, wherein the control circuit is configured to determine at least one of proximity to the electronic device, grip of the electronic device, a touch input to the electronic device, or occurrence of hovering with respect to the electronic device, based on positions in which the third electrodes are disposed on the electronic device.

3. The electronic device of claim 1, wherein the control circuit is configured to detect the change of the capacitance between the at least some first electrode and the at least some second electrode while maintaining an impedance in a specified range in the third electrodes.

4. The electronic device of claim 1, wherein the control circuit is configured to detect the change of the capacitance between the at least some first electrode and the at least some second electrode while applying, to the third electrodes, a second signal of a magnitude that is substantially the same as a magnitude of a first signal applied to the first electrodes or the second electrodes.

5. The electronic device of claim 1, wherein the control circuit is configured to:
   measure the change of the capacitance between the at least some first electrode and the at least some second electrode for a first period of a specified time period, and
   measure the capacitance related to the at least some third electrode for a second period of the specified time period.

6. The electronic device of claim 1, wherein the control circuit is configured to independently operate third electrodes included in the first node and third electrodes included in the second node, by using at least one switch.

* * * * *